Sept. 29, 1959 B. L. HENRY 2,906,224

METHOD OF FORMING LOCK STITCH

Filed Nov. 18, 1957 4 Sheets-Sheet 1

INVENTOR.
BEULAH LOUISE HENRY.

BY Clark & Ott

ATTORNEYS.

INVENTOR.
BEULAH LOUISE HENRY
BY
Clark & Ott
ATTORNEYS

INVENTOR.
BEULAH LOUISE HENRY

BY

Clark & Ott

ATTORNEYS.

Sept. 29, 1959 B. L. HENRY 2,906,224

METHOD OF FORMING LOCK STITCH

Filed Nov. 18, 1957 4 Sheets-Sheet 4

INVENTOR.
BEULAH LOUISE HENRY

BY

Clark & Ott

ATTORNEYS.

2,906,224

METHOD OF FORMING LOCK STITCH

Beulah Louise Henry, New York, N.Y.

Application November 18, 1957, Serial No. 697,122
3 Claims. (Cl. 112—262)

This invention relates to a lock stitch.

The invention contemplates an improved lock stitch formed from a single thread and a method of producing the same with a thread supplied from a single spool.

Lock stitches heretofore have been produced by interlocking a thread from a spool with a thread from a bobbin. The bobbins of standard lock stitch machines carry approximately eighty yards of thread and such machines make approximately six thousand stitches per minute. Since high speed machines use about twenty-eight yards of thread per minute, it follows that the bobbin must be replaced approximately every three minutes. This necessitates the interruption of the sewing to remove the empty bobbin and replace a full bobbin.

In order to overcome the aforesaid objection, the present invention provides a lock stitch and a method of producing the same which eliminates the use of a bobbin and which forms the lock stitch from a single strand supplied from a single spool. The formation of this lock stitch eliminates breaking of the threads which frequently occurs in the formation of lock stitches produced with the use of a bobbin, eliminates unraveling of the stitches and the failure of the needle and bobbin threads to properly form the lock stitches.

Another object of the invention is to provide a lock stitch seam in which the thread forms a single strand seam on one side of the fabric and a double strand seam on the opposite side thereof.

Another object of the invention is to provide a lock stitch of said character which may be produced from any desired strength and size of thread and which may be relatively heavy since the lock stitch is formed by needle thread loops projected through the material and interlocked with a loop on the under side. The lock stitch may also be produced in gang or multiple needle machines.

The invention also contemplates a lock stitch of the aforesaid character which is produced from two threads fed from independent spools and which provides a double strand seam on both sides of the fabric.

With the foregoing and other objects in view, reference is now made to the following specifications and accompanying drawings illustrating the manner of producing the lock stitch.

In the drawings:

Figs. 1 to 6 inclusive are enlarged perspective views showing successive steps in the method of producing a lock stitch from a single thread in accordance with the invention.

Figs. 11 to 15 inclusive are enlarged plan views illustrating the steps in the method of producing a lock stitch from two threads in accordance with the invention.

Figure 16:
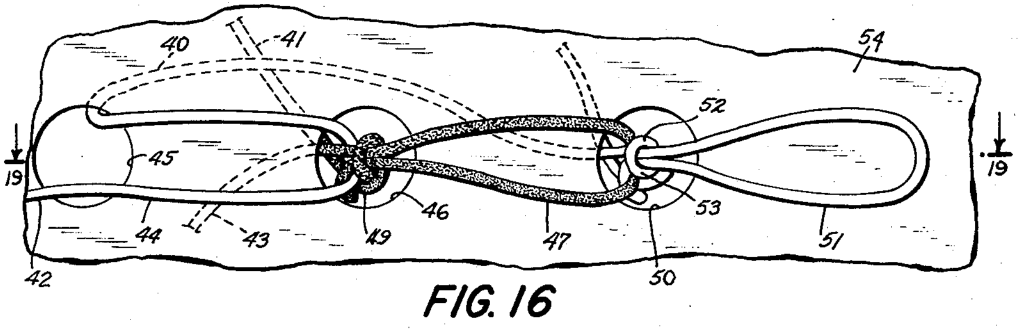

Fig. 16 is a plan view showing two of the completed lock stitches.

Figure 17:
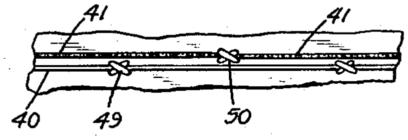

Fig. 17 is a plan view showing the lock stitches on one side of the fabric.

Figure 18:
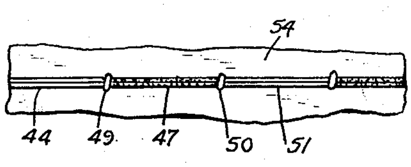

Fig. 18 is a plan view showing the lock stitches on the other side thereof.

Figure 19:
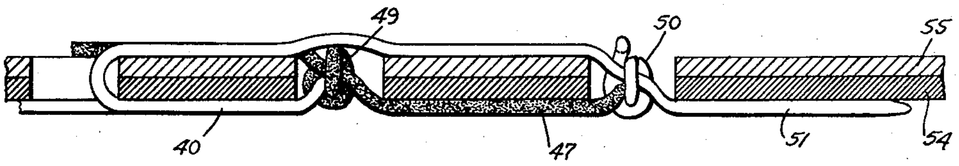

Fig. 19 is a longitudinal sectional view showing two of the completed lock stitches.

Referring to the drawings and more particularly to Figs. 1 to 10 inclusive thereof, the invention is illustrated in its application to a lock stitch seam formed from a single thread. The lock stitch seam may be produced automatically by means of a stitching machine or the same may be made by hand for sewing a seam in heavy fabric such as canvas or the like.

Figure 1:
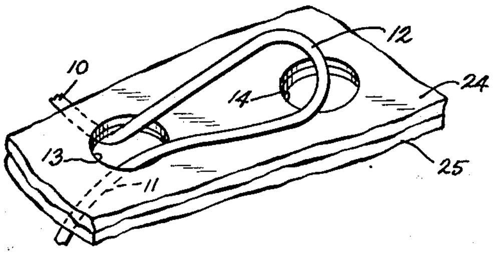
Figure 2:
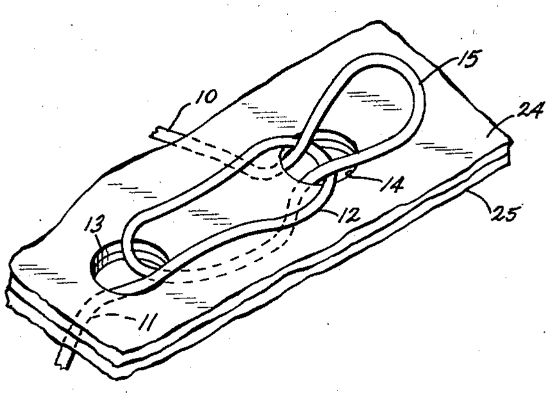
Figures 3, 4:
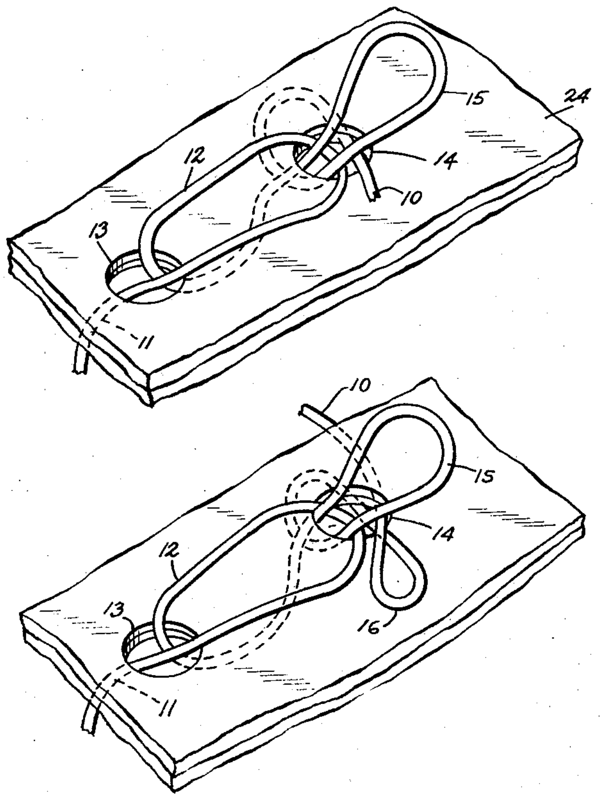

In producing the stitch a supply thread 10 is fed from a spool (not shown) with a needle (not shown) threaded thereon and the spool and the end 11 of the thread are located on one side of the fabric in which the seam is to be produced. The threaded end of the needle is forced through the fabric to produce a loop 12 extending through the opening 13 formed by the needle. The loop 12 is held so as to retain the formation thereof. The needle is then retracted through the opening 13 whereupon the fabric is advanced and the threaded end of the needle is again thrust through the fabric forming an opening 14 and producing a loop 15 which engages through the loop 12 as illustrated in Fig. 2 of the drawings. The loop 12 is then released and the loop 15 held so as to retain the formation thereof. The threaded end of the needle is then retracted through the opening 14 and reinserted through the opening 14 at one side of the loop 12 to form a loop 16. This loop is also formed at one side of the loop 15 and the loop 16 is twisted and cast over the loop 15 so that the loop 15 extends through the loop 16. The needle is then retracted through the opening 14 and the supply thread 10 is pulled so as to tighten the loop 16 about the base of the loop 15 at the opening 14 and forming the knot 17. The loop 15 is then held to retain the formation thereof whereupon the fabric is advanced to repeat the operation and form an opening 18 corresponding to the opening 14 and succeeding loops 19 and 20 corresponding to the loops 15 and 16 to thereby form another knot 21 similar to the knot 17. It will be understood that the loop 15 and all succeeding similar loops are formed on one side of the fabric which produces a double strand seam 22 on one side of the fabric and a single strand seam 23 on the opposite side.

As shown in Figs. 1 to 10 inclusive of the drawings, the lock stitch seam is illustrated in connection with the sewing together of two pieces of fabric 24 and 25. In forming the loops 12, 15 and 16 and all succeeding loops, the supply thread 10 is fed from the left side as illustrated in Figs 1 to 6 inclusive of the drawings. For convenience in illustrating the formation of the stitch, the fabric 24 is uppermost and the loops extend upwardly through the openings formed by the needle. However, either fabric may be uppermost and the loops may be formed above or below the fabrics. Constructed in this manner, the knots lock the seam between the stitches so as to prevent unraveling of the seam at the ends thereof as well as intermediate the knots.

In Figs. 11 to 18 inclusive of the drawings, the invention is illustrated in its application to a lock stitch formed from two threads. This lock stitch seam may be produced automatically by means of a stitching machine or the same may be made by hand for sewing heavy fabrics as in the single stitch seam.

Figure 12:
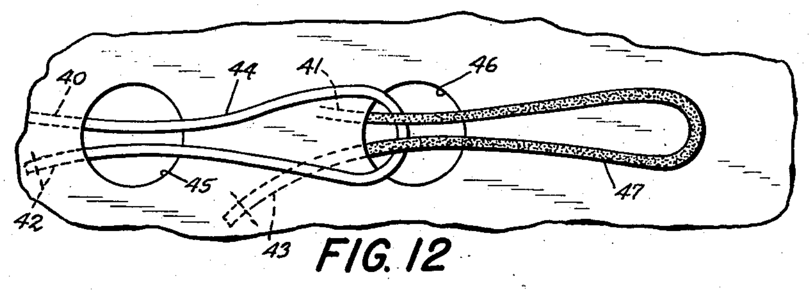
Figure 13:
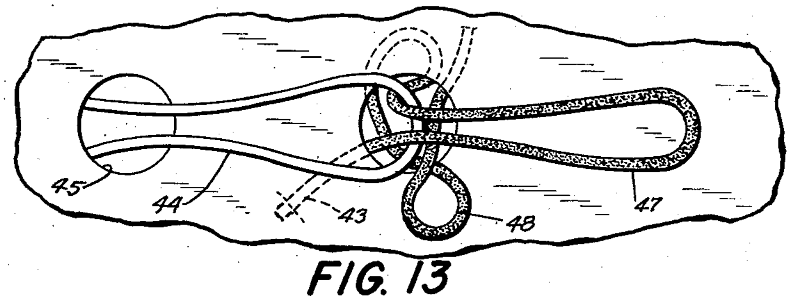
Figure 14:
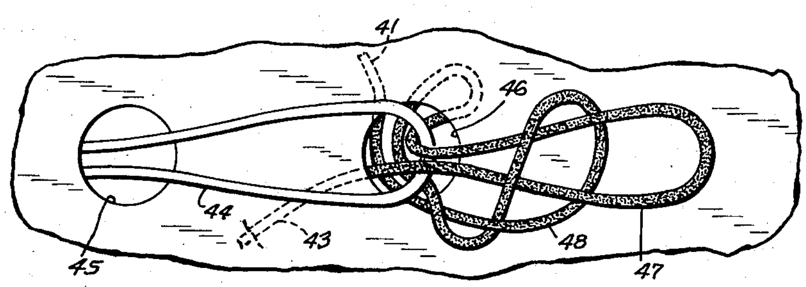
Figure 15:
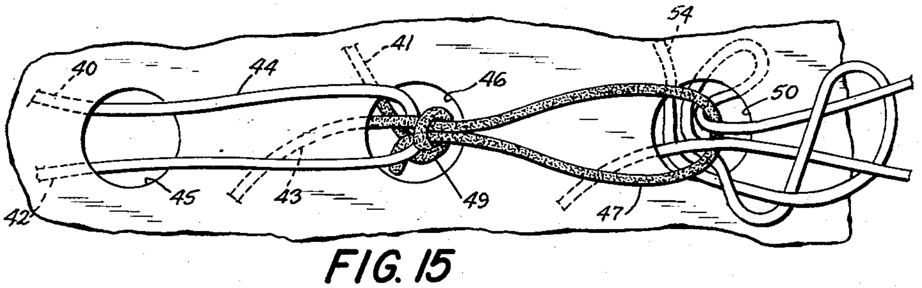

In making this lock stitch, two supply threads 40 and 41 are fed from spools (not shown) and both of the supply threads are threaded through needles and the spools and ends 42 and 43 of the threads are located on one side of the fabric in which the seam is to be produced. The needle threaded with the supply thread 40 is forced through the fabric to produce a loop 44 extending through an opening 45 formed by the needle. The loop 44 is held so as to retain the formation thereof. The needle is then retracted through the opening 45 whereupon the fabric is advanced and the needle threaded with the supply thread 41 is forced through the fabric producing an opening 46 and forming a loop 47 which extends through the loop 44 as illustrated in Fig. 12 of the drawings. The loop 44 is then released and the loop 47 held so as to retain the formation thereof. The needle is then retracted through the opening 46 and reinserted through the same opening at one side of the loops 44 and 47 so as to form a loop 48. The needle is then turned and the loop 48 cast over the loop 47 after which the needle is retracted through the opening 46 and the supply thread 41 drawn so as to tighten the loop 48 about the base of the loop 47 at the opening 46 and forming a knot 49. The loop 47 is then held to retain the formation thereof whereupon the fabric is advanced to repeat the operation so as to form another opening 50 corresponding to the opening 46 and a loop 51 formed from the supply thread 40 corresponding to the loop 44, the loop 51 extending through the loop 47 as shown in Fig. 15 of the drawings. A loop 52 is then formed from the supply thread 41 corresponding to the loop 47, the loop 52 being twisted and cast over the loop 51 and the thread 41 drawn tight so as to form a knot 53 corresponding to the knot 49.

It will be understood that the aforesaid loops 44, 47 and 48 and the corresponding succeeding loops are all formed on one side of the fabric. This lock stitch is illustrated in connection with the sewing together of two pieces of fabric 54 and 55 as shown in Fig. 19 of the drawings. The lops 44 and 51 form double strands in the seam, while the loops 47 and 52 form alternate stitches between the loops 44 and 51 as shown in Fig. 18 of the drawings. The fabric 54 is shown as being uppermost in the drawings and the aforesaid loops extending upwardly therethrough. However, either fabric may be uppermost and the loops may be formed above or below the pieces of fabric. The end 11 of the thread in the first form of the invention and the ends 42 and 43 of the threads in the second form are secured in any desired manner to the fabric prior to the formation of the loops 12, 44 and 47.

Figures 5, 6, 7:
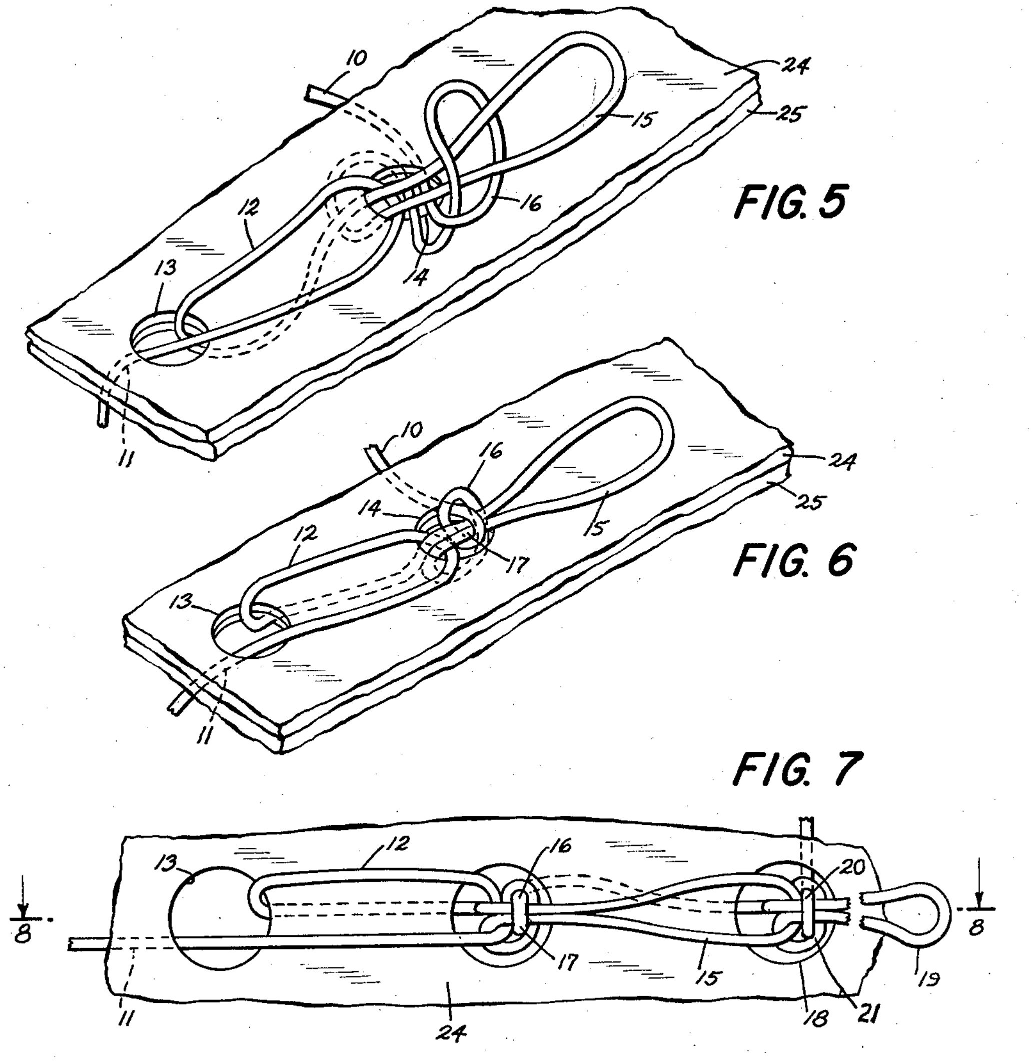
Fig. 7 is a plan view of two of the completed lock stitches.
Figure 8:
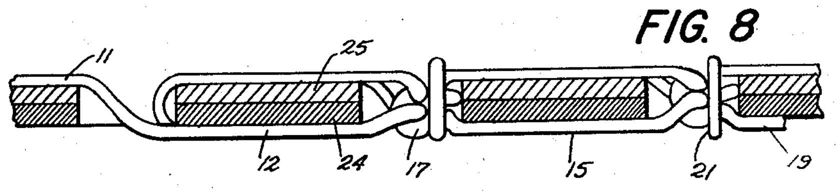
Fig. 8 is a longitudinal sectional view showing the two lock stitches.
Figure 9:
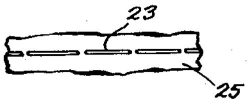
Fig. 9 is a plan view showing the lock stitches on one side of the fabric.
Figure 10:
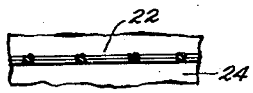
Fig. 10 is a plan view showing the lock stitches on the opposite side thereof.
Figure 11:
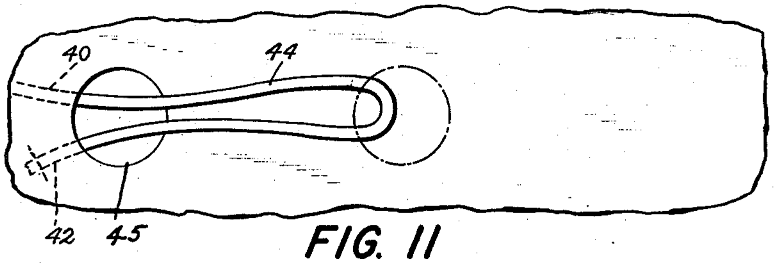

In twisting and casting the loops to form the knots in each of the forms, the supply thread extends over the work thread connected with the previously formed loop and the twisted loop is cast over the previously formed loop so as to dispose the supply thread underneath and the work thread connected with the previously formed loop extending over the said loop. For instance, as illustrated in Fig. 5 of the drawings, the loop 16 is twisted so that the supply thread 10 extends over the work thread connected with the loop 16 and the twisted loop 16 is cast over the loop 15 so that the supply thread 10 extends under the loop 15 and the work thread connected with the previously formed loop extends over the loop 15.

It will be understood that in each of the forms of the invention, the fabric is advanced any desired distance so as to make the desired length of stitches. It is also to be understood that each time the needle is retracted through the opening in the fabric, the needle slides on the thread of the previously formed loop.

While the preferred forms have been shown and described herein, it is to be understood that the invention is not so limited but shall cover any and all modifications thereof which fall within the purview of the invention.

What is claimed is:

1. A method of producing a lock stitch, comprising the steps of forming a first loop in a supply of thread on one side of a piece of material with at least one leg of the first loop extending through the material at a first point, then forming a second loop in a supply of thread on said one side of the material by passing a supply of thread through the material from the other side thereof to said one side thereof and simultaneously through the first loop with both legs of the second loop extending through the first loop and at least one leg of the second loop extending through the material at a second point spaced from said first point, then forming a third loop in the same supply of thread from which the second loop was previously formed and on said one side of the material with both legs of the third loop disposed outside the first and second loops and at least one leg of the third loop extending through the material adjacent said second point, turning the third loop and casting the same about the second loop, and drawing the thread of the third loop tight to tighten the third loop into a knot about the base of the second loop adjacent the end of the first loop.

2. A method as claimed in claim 1, in which the first, second and third loops are formed from the same length of thread.

3. A method as claimed in claim 1, in which the first loop is formed from a length of thread separate from the length of thread from which the second and third loops are formed.

References Cited in the file of this patent

UNITED STATES PATENTS

| | | |
|---|---|---|
| 1,559,840 | Baker | Nov. 3, 1925 |
| 1,575,186 | Baker | Mar. 2, 1926 |